United States Patent [19]
Hsia et al.

[11] Patent Number: 5,849,640
[45] Date of Patent: Dec. 15, 1998

[54] IN-SITU SOG ETCHBACK AND DEPOSITION FOR IMD PROCESS

[75] Inventors: Shaw-Tzeng Hsia, Taipei; Ching-Ying Lee; Chih-Cheng Liao, both of Hsinchu, all of Taiwan

[73] Assignee: Vanguard International Semiconductor Corporation, Hsin-Chu, Taiwan

[21] Appl. No.: 625,331

[22] Filed: Apr. 1, 1996

[51] Int. Cl.$^6$ .................................................. H01L 21/306
[52] U.S. Cl. .......................... 438/734; 438/706; 438/707; 438/710; 438/711; 438/712; 438/715; 216/63; 216/67; 216/70; 216/97
[58] Field of Search .................................... 438/706, 707, 438/710, 711, 712, 715, 734; 216/63, 67, 70, 97

[56] References Cited

U.S. PATENT DOCUMENTS

| | | | |
|---|---|---|---|
| 4,681,653 | 7/1987 | Purdes | 156/614 |
| 5,364,818 | 11/1994 | Ovellet | 437/195 |
| 5,413,940 | 5/1995 | Lin et al. | 437/7 |
| 5,447,613 | 9/1995 | Ouellet | 204/192.1 |
| 5,534,731 | 7/1996 | Cheung | 257/759 |
| 5,679,211 | 10/1997 | Huang | 156/643.1 |

OTHER PUBLICATIONS

S. Wolf, "Silicon Processing for the VLSI Era–vol. 2", Lattice Press, Sunset Beach, CA, p. 233 (1990).
Horne, D. "Microcircuit production technology" Adam Hilger ltd., pp. 89–90, 1986.

*Primary Examiner*—Ceila Chang
*Attorney, Agent, or Firm*—George O. Saile; Stephen B. Ackerman

[57] ABSTRACT

A method is disclosed for improved planarization and deposition of intermetal dielectric layers in semiconductor substrates. More specifically, the method involves the performance of specific process steps in-situ. That is, unlike in prior art, starting with cured spin-on-glass (SOG), the steps of SOG etchback and deposition of the intermetal dielectric PECVD, all take place sequentially in the same chamber and without a vacuum break. If not in the same chamber, then in the same load lock system. In this manner, it is shown that no longer does the SOG layer delaminate from the oxide layer. Furthermore, because the system is not exposed to moisture due to the absence of vacuum break, there is no adverse reaction when metal is deposited into the via holes. It is also shown that the behavior of SOG can be further improved when it is subjected to, after etchback, to argon sputter treatment, and/or oxygen plasma treatment in-situ, that is, without a vacuum break from the time the SOG etchback is performed to the time of depositing the next layer of PECVD oxide over the planarized surface. As a by-product of the steps enumerated above, the disclosed method also reduces the contact resistance of metal interfaces in via holes.

21 Claims, 5 Drawing Sheets

FIG. 1 - Prior Art

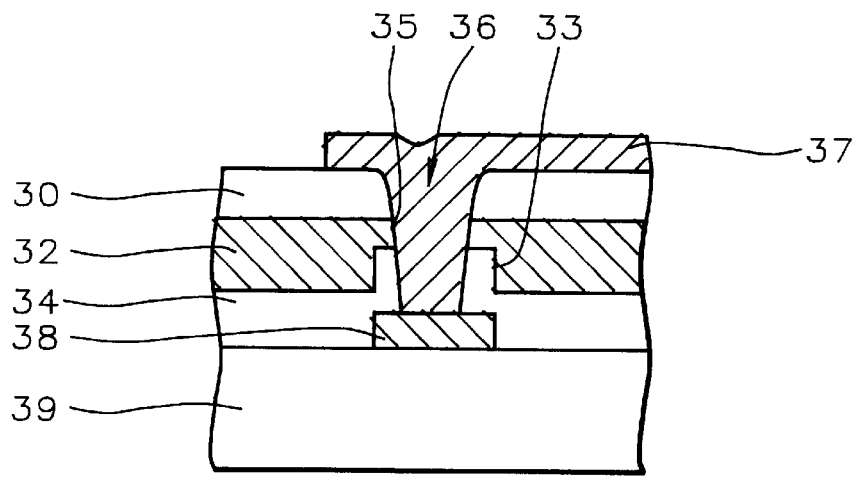
FIG. 3 – Prior Art
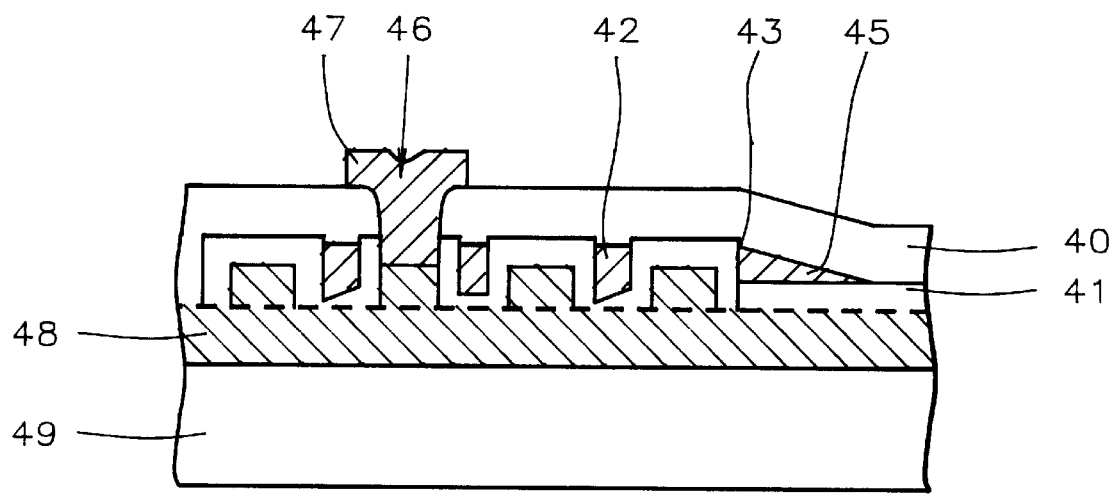
FIG. 4

IN-SITU SOG ETCHBACK AND DEPOSITION FOR IMD PROCESS

BACKGROUND OF THE INVENTION (1) Field of the Invention

The present invention relates generally to semiconductors, and more particularly to an integrated process for in-situ treatment of spin-on-glass in the deposition of intermetal dielectric (IMD) layers in integrated circuit substrates.

(2) Description of the Related Art

In the manufacture of integrated circuits, many active devices are at first built on a single semiconductor substrate. Regions of field isolation in the silicon substrate are formed. Thus, the devices themselves are electrically isolated from each other within the substrate. Then, in the MOS process, for example, a conductive gate is formed over a dielectric. The source and drain regions are heavily doped. Interlevel dielectric layers are deposited over these areas to serve as electrical insulators. (These well-known processing steps are neither shown in the Figures nor described in detail here in order not to unnecessarily obscure the present invention.) Subsequently, in the fabrication process, specific devices are interconnected with metal tracks or lines so as to form the desired electrical circuit. The metal lines are deposited on electrically insulating dielectric layers built upon the substrate in a sequential manner. Holes are opened at specific places in each intermetal dielectric layer (IMD) down to the metal below prior to the deposition of the next level of metal. The next level of metal is then deposited and interconnection between metal layers is established. This process is repeated until a multi-level semiconductor structure of desired circuit function is completed.

One of the main challenges in implementing such multi-level structures is the leveling or planarization of the intermetal dielectric layers. This is because as the various layers are sequentially built layer upon layer, each layer surface becomes more uneven than the previous one. This lack of planarity reduces the degree of precision with which each succeeding pattern (into which the most recently deposited layer will be shaped) can be aligned with respect to the pattern that preceded it. Another challenge is the chemical reaction between the various materials that are used in building the multi-level structure. For example, moisture released by a material during a process can react with nearby metal to cause corrosion, high electrical resistance between contacting surfaces, and so on. The former challenge can usually be met by an appropriate choice of a palanarizing material and a planarization technique thereof, and the latter by a judicious process step in treating the same material as disclosed in this invention.

Gap filling materials such as spin-on-glass (SOG) are found to be useful for planarizing surfaces. They are siloxanes or silicates mixed in alcohol-based solvents. The technique for applying involves the release of drips of liquid SOG on a spinning substrate covered by an intermetal dielectric layer. IMD layers are usually silicon oxide films deposited by means of any one of the chemical-vapor-deposited, or CVD processes such as atmospheric pressure CVD (APCVD), low-pressure CVD (LPCVD), and plasma-enhanced CVD (PECVD). Since SOG is applied to the surface in liquid form (i.e., uncured) it is capable of flowing into all the depressions in the surface to which it is applied, presenting a planar surface of its own once flow has ceased. Then it is converted into a solid material through a suitable heat treatment (i.e., cured). The ensuing solid material is essentially silicon oxide which is compatible with the other materials that form the integrated circuit as well as being compatible with any subsequent processing steps yet to be performed on the integrated circuit.

One of the advantages of using SOG as a planarizing material is that it can fill narrow spaces between metal lines and other patterned features without causing voids such as when CVD IMD films alone are used. Furthermore, they have smoothing effect on sharp, vertical edges and they enable good step coverage of metal lines without line width variation. Sometimes, two or more layers of SOG are spun on if sufficient planarization is not obtained with a single layer. Unfortunately, SOG cannot totally take the place of the IMD itself, because when an SOG film is formed to the thickness required of an interlevel dielectric, it exhibits an intolerable degree of cracking. (See S. Wolf, "Silicon Processing for the VLSI Era," vol.2, Lattice Press, Sunset Beach, Calif., 1990, p. 233). Thus SOG is primarily used over a CVD oxide to smooth, or planarize, the surface. Once the planarization has been achieved, the thin layer of SOG may then be cured and left there and covered over by another layer of CVD oxide, thus resulting in a sandwich of smooth and planar outer surface. Or, the SOG may be removed by etching back to the CVD oxide layer below, which is now smoothened out by the remaining SOG in the troughs between the metal lines. The former process is referred to as "non-etchback SOG",and the latter as "etchback SOG." (S. Wolf, Ibid.) Methods that are used for etchback process are several. These include the well-known methods such as sputter etch, plasma etch and reactive ion-etch (RIE) as discussed in Wolf's book mentioned above.

In prior art, planarization is accomplished generally along the lines that have been described above. That is, either SOG etchback or non-etchback process is used and then the manufacture of the integrated circuit is continued with the application of additional layers of material. However, with the continuation of the subsequent steps without proper treatment of the SOG, it has been observed as a part of manufacturing experience that when part of a previously deposited SOG layer is exposed as a result of, for example, etching away adjacent layers that previously covered the SOG layer, there is a tendency for such exposed SOG surfaces to undergo outgassing under conditions of moderate heating. For example, in U.S. Pat. No. 5,413,940 the conventional steps of flow-chart in FIG. 1 are used. The prior art example cited in said Patent is reproduced in FIG. 3 here where, via holes (36), etched between two levels of metal-1 (38) and metal-2 (38) pass through a layer of SOG (32) which has been cured but has not been subjected to etchback process. Regions 30 and 34 are the PECVD oxide layers that have been sandwiched with the SOG layer in between. The respective process steps 11 through 18 shown in the flow-chart in FIG. 1 are as follows: M1 deposition, IMD-1 deposition, SOG coating, SOG curing, SOG etchback or non-etchback, as the case may be, IMD-2, via patterning and an outgassing step which is performed as a last step before the deposition of metal layer M2 which is not shown.

In practice, with such a process alone without further treatment of the SOG, outgassing results of previously trapped moisture while a layer of metal is being deposited onto the inside of the via holes. This emitted moisture reacts with the metal as it is being deposited, resulting in high contact resistance between the freshly deposited metal layer and the surface of a metal layer at the bottom of the via hole. Or, when step 15 is an etchback SOG process so that SOG remains only in troughs between metal lines, and without any further SOG treatment, delamination occurs in areas

(33) shown in FIG. 3. To alleviate some of the problems associated with outgassing during metal deposition into the via holes, the substrate is heated to drive off the moisture after the via holes have been opened and prior to depositing the metal. This outgassing step is accomplished at a prescribed temperature and for a specific period of time as described in U.S. Pat. No. 5,413,940.

It will be appreciated in the disclosure of the present invention that such a step will not be necessary when the SOG etchback and IMD deposition are performed sequentially, without a vacuum break, in the same vacuum chamber, or in different chambers but under the same vacuum lock system, that is, in-situ. By not subjecting the SOG to atmospheric ambient conditions in between steps of SOG etchback (or non etchback, as the case may be), and IMD deposition, complex water absorption mechanisms are averted and peeling or delamination between SOG and IMD (such as PECVD oxide) are avoided. Furthermore, by preventing, in the first place, the absorption of water at this step removes the cause for reaction while a layer of metal is being deposited onto the inside of the via holes at a later step. Thus, this in-situ process of sealing away the moisture from the insides of the vacuum chamber yields two-fold advantage; firstly, the prevention of delamination of the SOG from PECVD oxide layer in regions such as 33 in FIG. 3, or region 43 and 45 in FIG. 4, and secondly, the prevention of said metal reaction in region such as 35 in FIG. 3, and the concomitant high contact resistance in the via holes. To further improve the conditions for said lamination and electrical characteristics, the methods disclosed in this invention also include a special argon treatment, or oxygen plasma, or both, of the SOG during etchback, but prior to IMD deposition, and most importantly, again in-situ, that is, without a vacuum break. It is believed that this treatment removes any remnants of moisture that may be harbored in the SOG remaining after etchback.

In another prior art, U.S. Pat. No. 5,364,818 discloses a method whereby an attempt is made of in-situ outgassing of water and reaction by-products in a deposition chamber and then capping the substrate in a moisture-free environment with a protective dielectric layer resistant to moisture diffusion. But no etchback is performed. Since the etchback process itself removes by-products by virtue of removing the material that harbors them, in the absence of such a process, they remain. Consequently, in a normal environment in practice, the by-products thereof, including water, cause delamination of areas (33) such as shown in FIG. 3.

SUMMARY OF THE INVENTION

It is therefore a primary object of this invention to provide a method for eliminating delamination between intermetal dielectric (IMD) layers.

It is a further object of this invention to provide a method for eliminating delamination between contacting surfaces in a via hole.

It is still another object of this invention to improve electrical resistance between contacting surfaces in via holes.

These objectives are accomplished by first depositing plasma enhanced PETEOS oxide on a substrate provided with first level metal M1. The oxide is then coated with a gap filling material such as spin-on-glass (SOG) and then cured. Reactive ion-etch (RIE) is next used to etch back the SOG. The sequential process is followed by a special treatment of the SOG comprised of an argon sputtering or an oxygen plasma, or both, and performed in-situ, that is, without a vacuum break. Still with no vacuum break, and still in the same vacuum chamber, or in a different chamber but under the same load lock system, the next level of intermetal dielectric, IMD-2 is deposited in-situ. The ensuing step of via patterning is completed by employing conventional methods. Unlike in prior art, a separate outgassing step after via etch is not required.

BRIEF DESCRIPTION OF THE DRAWINGS

FIG. 3 shows a prior art via hole where a layer of spin-on-glass that had previously been covered over is now exposed.

FIG. 4 shows areas of potential delamination between spin-on-glass and oxide layers.

DESCRIPTION OF THE PREFERRED EMBODIMENTS

Figure 1:
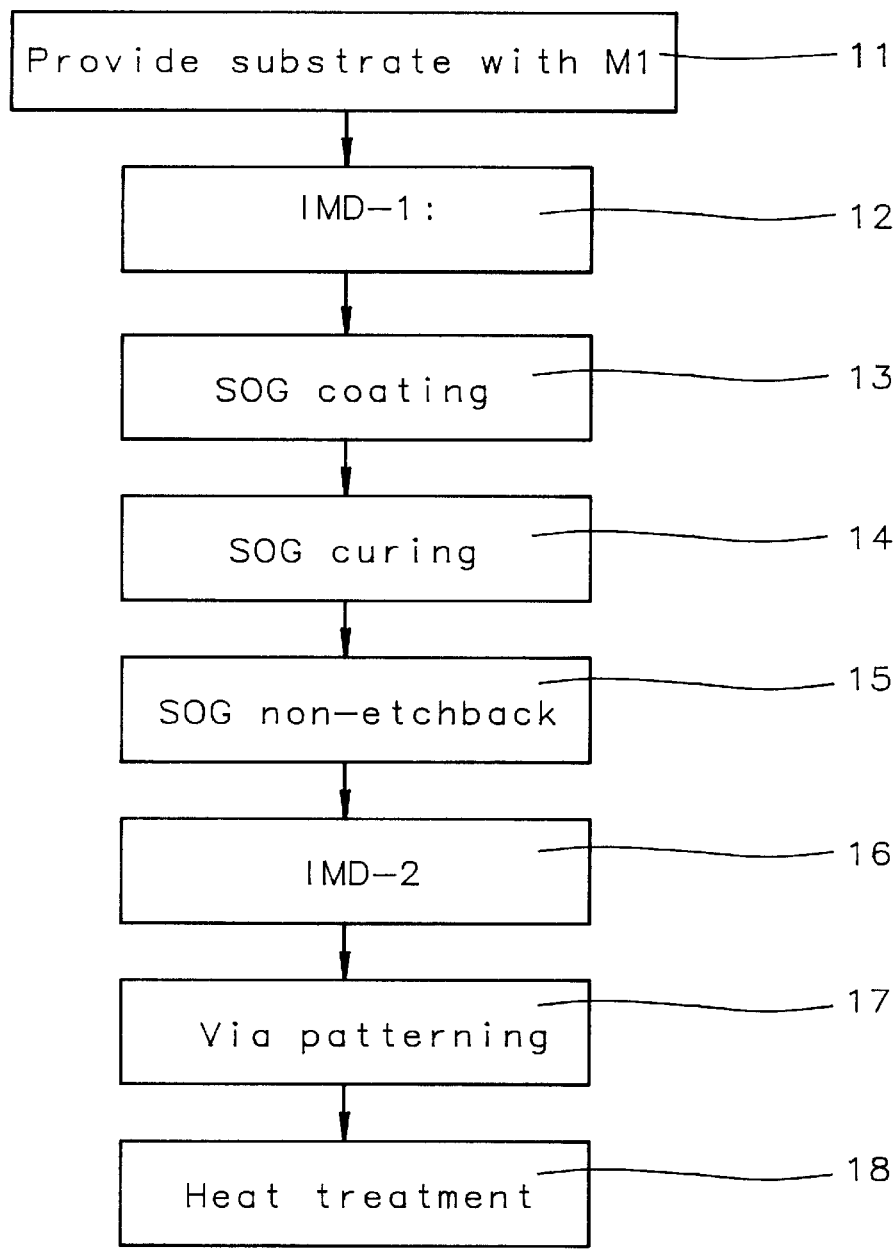
FIG. 1 is a flow-chart showing process steps in a prior art method of depositing intermetal dielectric layers.

Referring now to FIG. 1 of prior art, a series of process steps are shown in depositing intermetal dielectric layers on a partially completed integrated substrate. FIG. 3 depicts schematically the physical manifestation of the process steps in FIG. 1. Thus, the substrate provided in step 11 of FIG. 1 is the silicon body 39 (which has been subjected to prior processing not discussed or shown here) in FIG. 3. A metal layer 38 has been deposited onto 39 and etched into the shape of a metal line (shown edge on in FIG. 3). As per step 12 in FIG. 1, an insulating layer 34 has been deposited over the metal layer contouring its surface, as shown (FIG. 3). A layer of a gap filling material such as spin-on-glass (SOG) 32 has been deposited (step 13) over insulating layer 34 returning the surface to a planar condition. Once the SOG layer has been cured per step 14, it may be etched back. For purposes of illustration, a non-etchback case (15) is shown for the prior art in FIG. 3, while in FIG. 4, the SOG is etched back which is key to the spirit of the present invention. It will be noted that, the SOG in FIG. 4 fills in the narrower regions such as 42 and 32, and planarizes the surface of the IMD-1. The next step in prior art is to deposit the second IMD-2 (step 16) followed by via patterning (step 17), that is, etching open the via holes from the surface down to the metal level M1. An example of such a via hole is marked 36 in FIG. 3. It is seen that the surface of SOG layer in region 35 has now been exposed.

The next step in the manufacturing process would normally be the deposition of a second metal layer, shown as 37 in FIG. 3, for the purpose of making electrical contact between layers 36 and 38. There is, however, the possibility that the SOG surface 35 that has been exposed inside the via hole will outgas during the process of laying down layer 36. This will lead to creation of a poorly conducting contact surface in the via hole. In order to avoid this outgassing problem, the substrate is heat treated (step 18) in vacuum, just prior to the deposition of layer 36.

Figure 2:
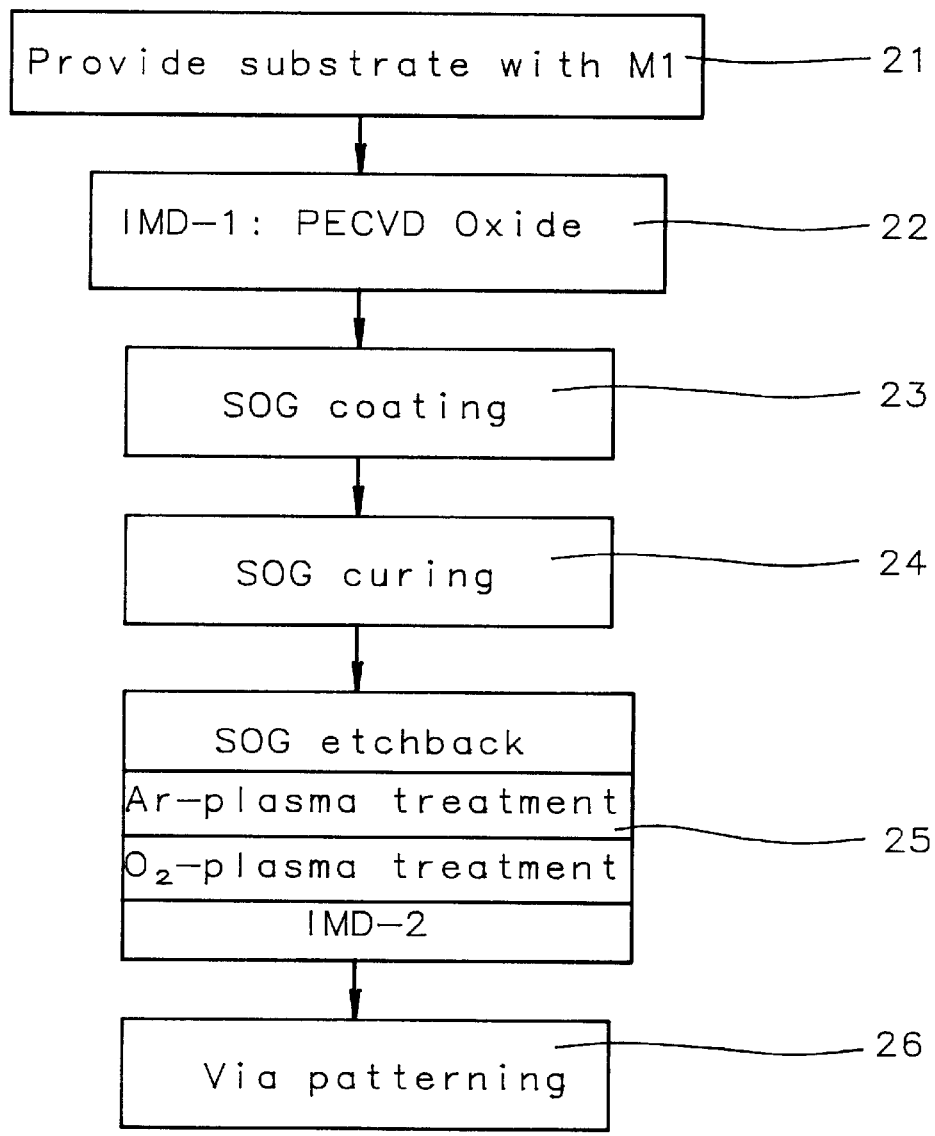
FIG. 2 is a flow-chart of the present invention showing the in-situ treatment of spin-on-glass as an integral part of the inter-metal dielectric deposition process.

It is disclosed in the present invention that such a step is not necessary when the SOG etchback and IMD deposition are performed sequentially, without a vacuum break, in the same vacuum chamber, or in different chambers but under the same vacuum lock system, that is, in-situ as shown in step 25 in FIG. 2. To allow the planarization of submicron spaces as small as 0.8 micrometers, the preferred dielectric in step 22 of FIG. 2 is PECVD Oxide. The SOG etchback in step 25 is performed by reactive-ion-etch (RIE) where the plasma is a fluorocarbon gas such as $CF_4$ and/or $CHF_3$. (Steps 23 and 24 are the same as in FIG. 1). By not subjecting the SOG to atmospheric ambient conditions in between the sub-steps of SOG etchback and IMD deposition as shown in step 25 of FIG. 2, complex water absorption mechanisms are averted and peeling or delamination between SOG and IMD (such as PECVD oxide) are avoided such as in regions 43 and 45 in FIG. 4. Furthermore, by preventing, in the first place, the absorption of water at this step 25 removes the cause for reaction while a layer of metal is being deposited onto the inside of the via holes at a later step. Thus, this in-situ process of sealing away the moisture from the insides of the vacuum chamber yields two-fold advantage; firstly, the prevention of delamination of the SOG from PECVD oxide layer in regions such as 33 in FIG. 3, or region 43 and 45 in FIG. 4, and secondly, the prevention of said metal reaction in region such as 35 in FIG. 3, and the concomitant high contact resistance in the via holes. To further improve the conditions for said lamination and electrical characteristics, the preferred embodiment incorporates a special argon treatment, or oxygen plasma, or both, of the SOG immediately after etchback (all in step 25), but prior to IMD-2 deposition, and most importantly, again in-situ, that is, without a vacuum break, an important feature that is key to the spirit of the present invention. After step 25, via patterning is accomplished as in prior art; however, no further heat treatment is necessary. The deposition of the next level of metal (47 in FIG. 4) may proceed immediately to connect it to metal layer 48, without any detrimental effects emanating from outgassing as experienced in prior art methods.

Figure 5:
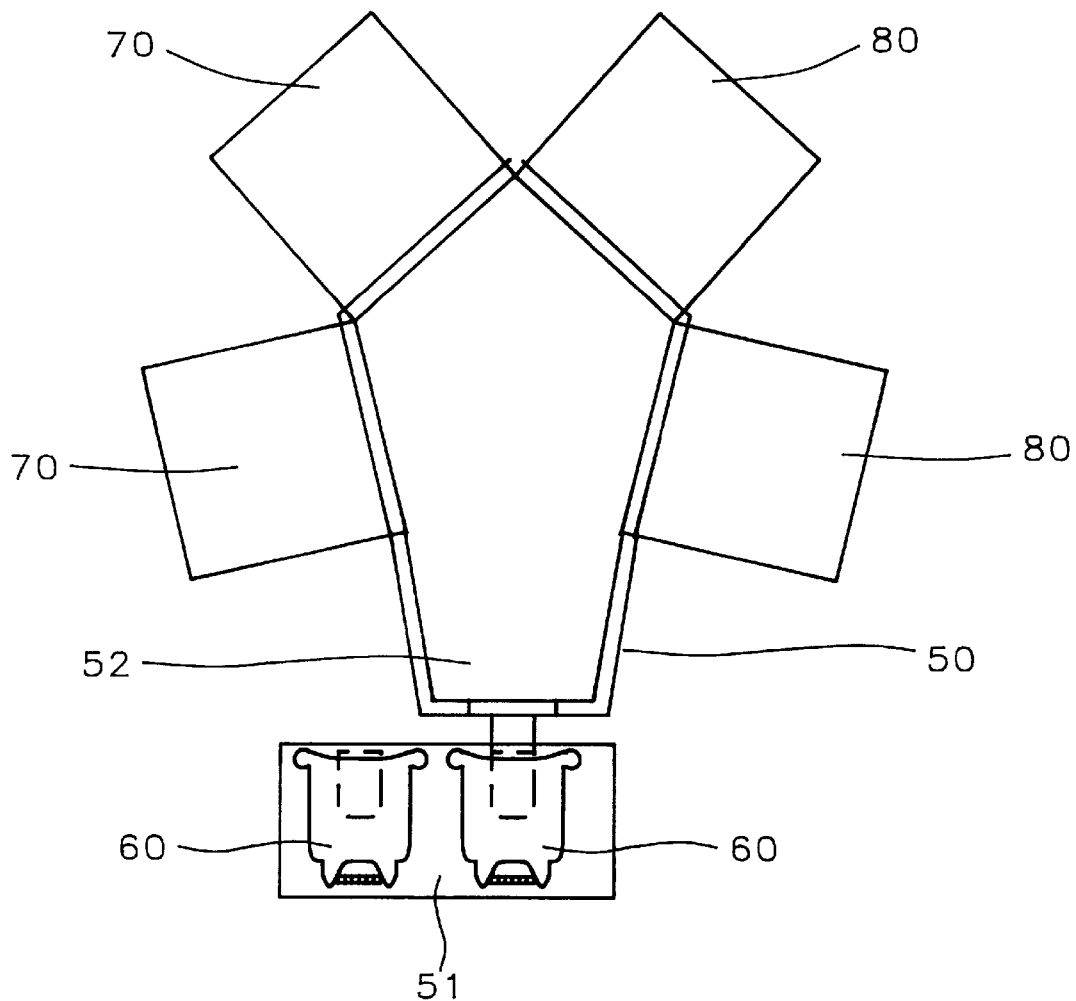
FIG. 5 is a plan view of a multi-chamber vacuum apparatus, including treatment and oxide deposition chambers within the same load lock system.
Figure 6:
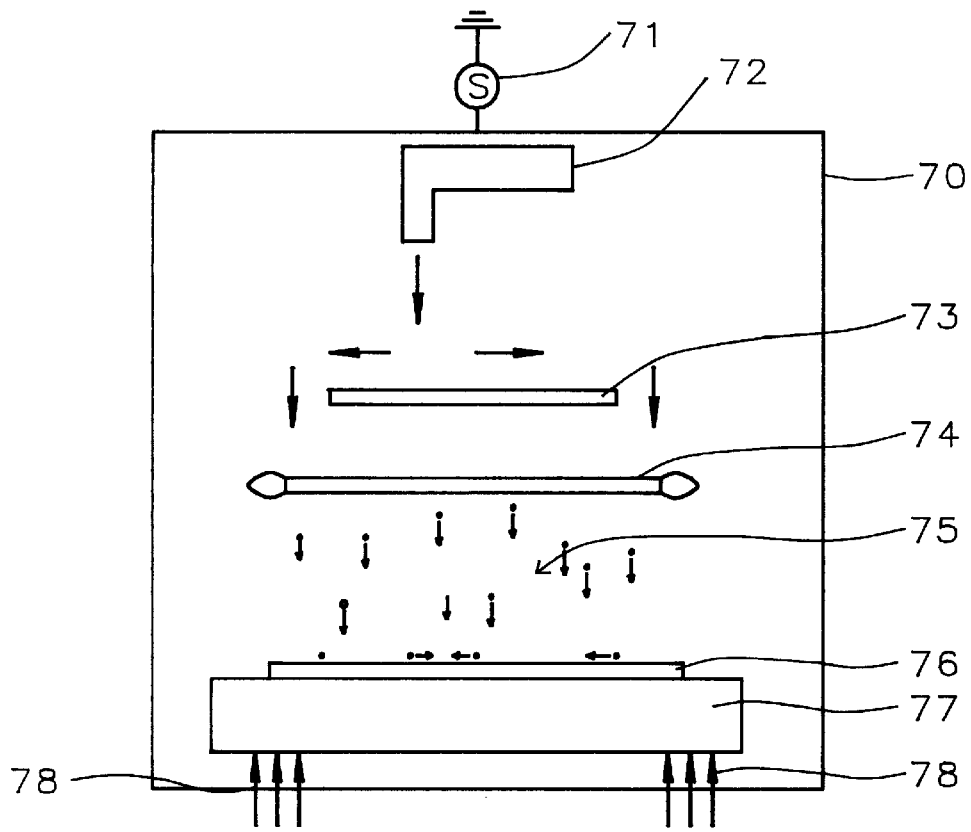
FIG. 6 shows details of chemical vapor deposition CVD chamber.
Figure 7:
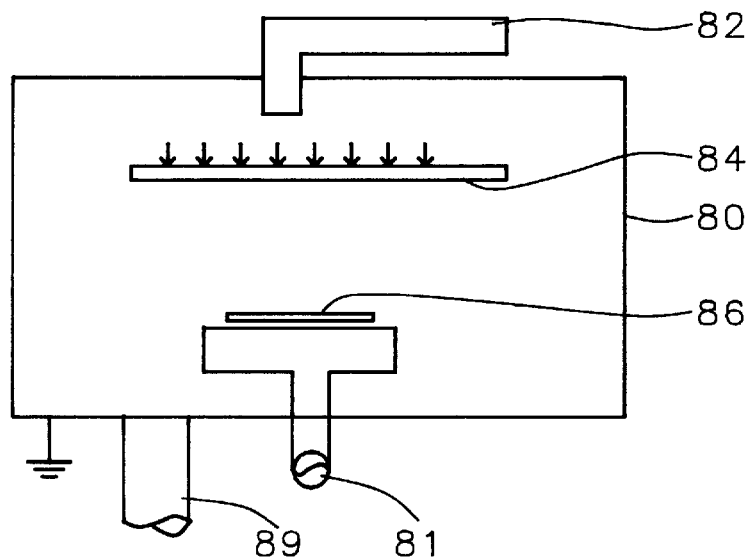
FIG. 7 shows details of Etch chamber.

The method of present invention is accomplished in a multi-chamber vacuum apparatus (50) shown in FIG. 5. The apparatus is such that the sub-steps of step 25 in FIG. 2 all take place in one vacuum locked system, which is key to the present invention. In the present embodiment, the substrates in cassettes 60 are transferred from chamber 51 to vacuum chamber 52. RIE etchback and then argon and/or oxygen plasma treatment(s) are performed in etch chamber 80, whereas the oxide layers are deposited in deposition chamber 70 using the PECVD process without breaking vacuum It will be appreciated by those skilled in the art that having both the etching and depositing chambers in the same system makes possible the avoidance of vacuum break, which in turn avoids particle contamination as well as peeling between SOG and said PECVD oxide due the absence of exposure to atmospheric conditions containing particulate contaminants and water vapor. FIG. 6 shows the details of CVD chamber 70, where 71 is the plasma rf generator; 72, the plasma gas source; 74, the shower head for gasses 75; 76, the wafer placed on the moving belt 77; and 78, the heat lamps that provide heating during the deposition process. In processes where tetraethyl orthosilicate (TEOS) films are deposited, a TEOS blocker 73 is also used. Similarly, FIG. 7 shows details of etch chamber 80, where 81 provides the rf power; 82 is the gas source; 84, the gas distribution plate; 86, the wafer, and 89, the pump to remove the gaseous by-products together with unused reactant and diluent gases.

While the invention has been particularly shown and described with reference to the preferred embodiments thereof, it will be understood by those skilled in the art that various changes in form and details may be made without departing from the spirit and scope of the invention. For instance, the procedures described her are equally applicable to the fabrication of MOS or bipolar devices.

What is claimed is:

1. A method of planarizing gap filling material in depositing intermetal dielectric layer on a semiconductor substrate comprising the sequencial steps of:

providing a silicon substrate over which is formed a metal layer;

depositing first intermetal dielectric layer;

coating said layer with gap filling material;

performing reactive-ion-etch (RIE) of said gap filling material in first fluorocarbon plasma gas;

continuing RIE etchback of said gap filling material in a second fluorocarbon plasma gas;

performing, without vacuum break, argon treatment of said planarized gap filling material;

performing, without vacuum break, oxygen treatment of said planarized gap filling material; and depositing, without a vacuum break, of a second intermetal dielectric layer.

2. The method of claim 1, wherein the first intermetal dielectric layer is PECVD oxide, and the said gap filling material is spin-on-glass (SOG).

3. The method of claim 2, wherein said oxide layer is deposited at a temperature in between about 200 to 500° C.

4. The method of claim 2, wherein said SOG coating is cured at a temperature in between about 350 to 475° C.

5. The method of claim 1, wherein the first plasma gas of said RIE etchback is fluorocarbon $CHF_3$.

6. The method of claim 5, wherein the temperature of said plasma gas is set in between about 15 to 25° C.

7. The method of claim 5, wherein the volume of said plasma is in between about 20 to 350 standard cubic centimeters (sccm).

8. The method of claim 5, wherein the pressure of said plasma is in between about 50 to 500 mT.

9. The method of claim 5, wherein the magnetic radio frequency of the plasma is in between about 20 to 80 Hz.

10. The method of claim 5, wherein the power of the plasma is set in between about 700 to 900 watts.

11. The method of claim 5, wherein the duration for the plasma is in between about 50 to 200 seconds.

12. The method of claim 1, wherein the second plasma gas is fluorocarbon $CF_4$.

13. The method of claim 12, wherein the temperature of said plasma gas is set in between about 15 to 25° C.

14. The method of claim 12, wherein the volume of said plasma is in between about 20 to 350 standard cubic centimeters (sccm).

15. The method of claim 12, wherein the pressure of said plasma is in between about 50 to 500 mT.

16. The method of claim 12, wherein the magnetic radio frequency of the plasma is in between about 20 to 80 Hz.

17. The method of claim 12, wherein the power of the plasma is set in between about 700 to 1100 watts.

18. The method of claim 12, wherein the duration for the plasma is in between about 50 to 200 seconds.

19. The method of claim 1, wherein the second layer is PECVD oxide.

20. The method of claim 1, wherein said argon treatment is performed at a pressure between about 25 to 100 mtorr, flow rate between about 40 to 100 standard cubic centimeters per minute (sccm), power level between about 825 to 1000 watts, for between about 3 to 10 seconds.

21. The method of claim 1, wherein said oxygen treatment is performed at a pressure between about 50 to 200 mtorr, flow rate between about 50 to 300 sccm, power level between about 500 to 1100 watts, for between about 5 to 20 seconds.

* * * * *

UNITED STATES PATENT AND TRADEMARK OFFICE
CERTIFICATE OF CORRECTION

PATENT NO.   : 5,849,640
DATED        : Dec. 15, 1998
INVENTOR(S)  : Shaw-Tzeng Hsia, Ching-Ying Lee, and Chih-Cherng Liao It is certified that error appears in the above-identified patent and that said Letters Patent is hereby corrected as shown below:

On the Cover Page, at (75), delete Chih-Cheng Liao, and replace with --Chih-Cherng Liao--.

Signed and Sealed this

Seventh Day of September, 1999

Attest:

Q. TODD DICKINSON

Attesting Officer

Acting Commissioner of Patents and Trademarks